United States Patent [19]

Furutani et al.

[11] Patent Number: 5,561,592
[45] Date of Patent: Oct. 1, 1996

[54] HYBRID INTEGRATED CIRCUIT MODULE

[75] Inventors: Nagahisa Furutani; Nobutoshi Fukuden, both of Kawasaki, Japan

[73] Assignee: Fujitsu Limited, Kawasaki, Japan

[21] Appl. No.: 355,560

[22] Filed: Dec. 14, 1994

[30] Foreign Application Priority Data

Jan. 12, 1994 [JP] Japan ................... 6-001549

[51] Int. Cl.⁶ ................................... H05K 7/20
[52] U.S. Cl. .................. 361/707; 257/678; 257/713; 361/719; 361/738
[58] Field of Search .................. 174/250, 251, 174/252, 257; 165/80.3, 185; 437/209; 257/778, 531, 532, 712, 678, 680, 681, 690, 713, 723, 724; 439/68, 69; 361/688, 704, 707–712, 717–719, 722, 736, 749, 752, 760, 761, 763, 766, 772, 774, 777, 783, 807, 813, 738

[56] References Cited

U.S. PATENT DOCUMENTS

| | | | |
|---|---|---|---|
| 3,582,762 | 6/1971 | Mori | 361/704 |
| 4,001,711 | 1/1977 | Knutson | 330/66 |
| 4,297,647 | 10/1981 | Akiyama | 330/307 |
| 4,965,526 | 10/1990 | Craft | 330/66 |
| 5,159,433 | 10/1992 | Kazami | 357/75 |
| 5,223,741 | 6/1993 | Bechtel | 257/678 |
| 5,270,493 | 12/1993 | Inoue | 174/253 |

FOREIGN PATENT DOCUMENTS

| | | |
|---|---|---|
| 0306890 | 3/1989 | Germany . |
| 0478426 | 4/1992 | Germany . |

*Primary Examiner*—Gerald P. Tolin
*Attorney, Agent, or Firm*—Armstrong, Westerman, Hattori, McLeland & Naughton

[57] ABSTRACT

In a hybrid integrated circuit module in which circuit components, including semiconductor devices and chip components, are integrated and which is bonded onto a heat-sinking substrate, a substrate for mounting chip components is made of a low thermal conductivity material and is bonded onto the heat-sinking substrate; a base plate for mounting semiconductor devices is made of a high thermal conductivity material and is bonded onto the heat-sinking substrate; a hollow cover covers a space above the base plate to make an enclosure between the base plate and the cover; a sealing means hermetically seals the enclosure; and a plurality of interconnection leads is formed through the cover to electrically connect a circuit on the base plate and a circuit on the substrate and for testing operating signals in the semiconductor devices.

14 Claims, 16 Drawing Sheets

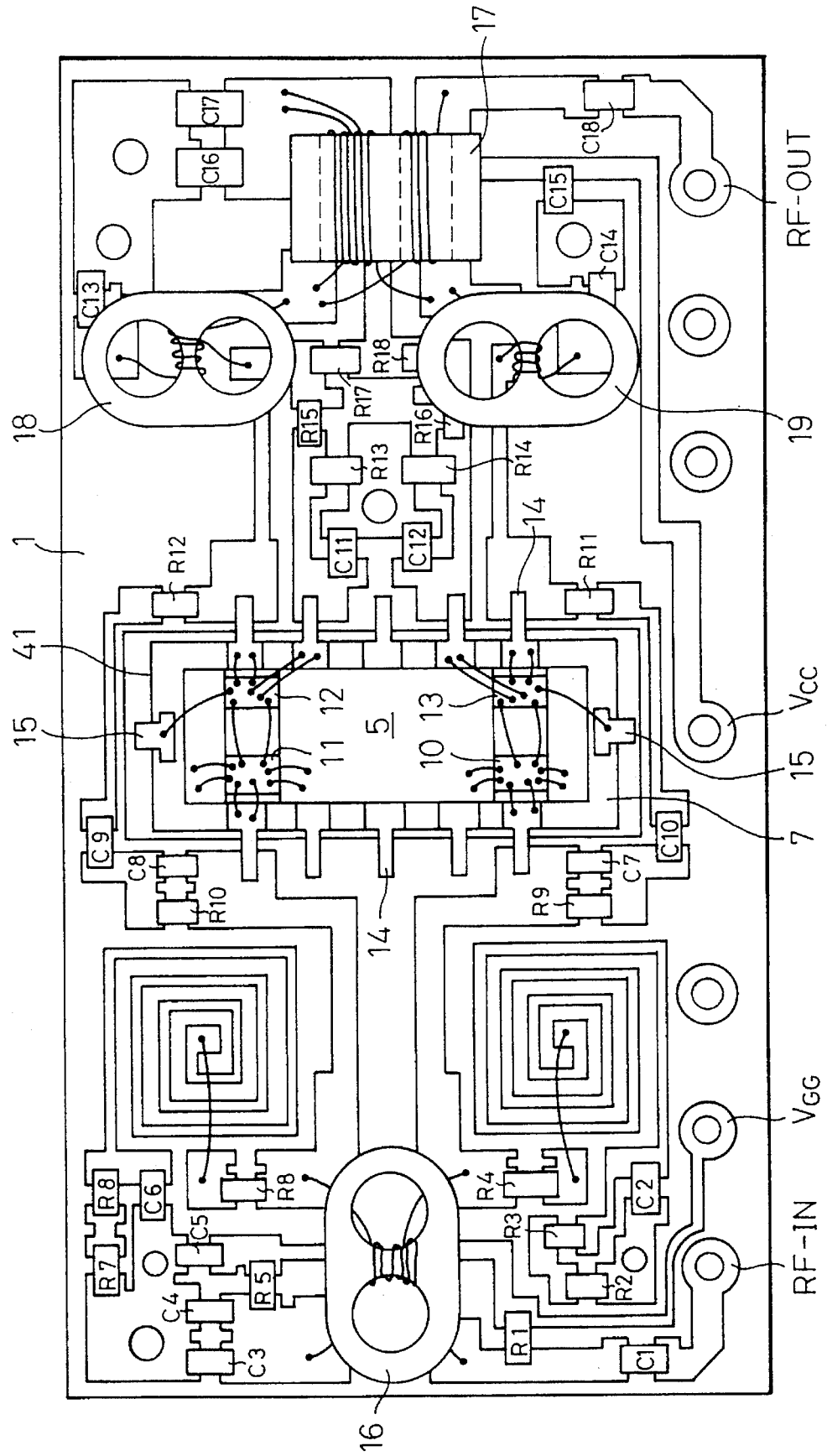

HYBRID INTEGRATED CIRCUIT MODULE

BACKGROUND OF THE INVENTION

1. Field of the Invention

The present invention relates to a hybrid integrated circuit module containing a hybrid integrated circuit, and more particularly to a hybrid integrated circuit module having high reliability, well suited for mass production, and inexpensive to manufacture.

2. Description of the Related Art

In recent years, various types of hybrid integrated circuits have been developed and commercialized for applications ranging from low-frequency to microwave ranges, as can be found in 50 MHz to 1000 MHz bands CATV amplifiers, portable 800 MHz to 1000 MHz band telephone transmitter amplifiers, 1 GHz or higher microwave amplifiers, etc.

To achieve general use of such hybrid integrated circuits, it is imperative to improve the reliability of the hybrid integrated circuit modules in which the hybrid integrated circuits are contained.

According to prior art hybrid integrated circuit modules, such as the one disclosed in U.S. Pat. No. 4,965,526, an alumina substrate is used as the hybrid integrated circuit substrate, on which semiconductor devices, such as Si transistors or GaAs FETs, chip resistors, thin-film resistors, chip capacitors, chip inductors, transformers, etc. are mounted.

Further, for enhanced reliability, the entire hybrid integrated circuit is covered with plastic, which is then sealed with a resin.

Furthermore, in the prior art hybrid integrated circuit module, electrodes, on which circuit components are soldered, are formed in the shapes that match the shapes of the individual circuit components.

Using an alumina substrate for the substrate of the hybrid integrated circuit, as in the prior art, is surely advantageous for mounting of circuit components that can generate heat, because the alumina substrate is a good thermal conductor.

However, not only is the alumina substrate itself expensive, but the interconnection pattern has to be formed by gold plating, since chip components such as a chip transistor cannot be mounted without gold plating on the alumina substrate. The gold plating causes the hybrid integrated circuit module to be expensive to manufacture. Another problem in using the alumina substrate is that the high thermal conductivity of the alumina substrate impairs the solderability of the circuit components and, accordingly, mass production efficiency is lost.

To resolve these problems, the hybrid integrated circuit substrate can be constructed using a glass-epoxy-based material that is inexpensive and that has low thermal conductivity. Implementing this, however, requires a design that can effectively cope with the heat that the circuit components generate.

Furthermore, the construction that involves covering the entire hybrid integrated circuit with plastic and sealing it with a resin, as in the prior art, has the problem of degradation of semiconductor device reliability in the long term because of insufficient hermeticity, since plastic has a low resistance to moisture.

Moreover, the construction that involves forming the electrodes, to which the circuit components are attached, in the shapes that match the shapes of the individual circuit components, as in the prior art, has the problem that mass production efficiency is reduced since, of the circuit components, chip components are the most difficult to remove.

That is, when it becomes necessary to replace a resistance-adjusting chip component, etc. after mounting because it does not provides the prescribed resistance value, etc., for example, the mounting portions of the chip component are heated and unsoldered using a soldering iron. The problem here is that heating the two ends at the same time is not an easy job, hence the difficulty in removing the chip component.

In such cases, previous methods for removing the chip component have been by heating the two portions at the same time by using two soldering irons or a special soldering iron having a bifurcated soldering head.

SUMMARY OF THE INVENTION

The object of the present invention is to provide a hybrid integrated circuit module that can realize high reliability, is well suited for mass production, and is inexpensive to manufacture.

According to one aspect of the present invention, there is provided a hybrid integrated circuit module, in which circuit components including semiconductor devices and chip components are integrated and which is bonded onto a heat-sinking substrate, comprising a substrate for mounting the chip components, a base plate for mounting the semiconductor devices, a hollow cover to make an enclosure between the base plate and the cover, a sealing means to hermetically seal the enclosure, a plurality of interconnection leads for electrically connecting a circuit on the base plate and a circuit on the substrate, and a pair of interconnection leads for testing operating signals of the semiconductor devices. The substrate for mounting the chip components has a low thermal conductivity and is bonded onto the heat-sinking substrate. The base plate for mounting the semiconductor devices has a high thermal conductivity and is bonded onto the heat-sinking substrate. The hollow cover for making an enclosure between the base plate and the cover encloses a space above the base plate. The sealing means for hermetically sealing the enclosure is used at a joint face of the base plate and the cover. The plurality of interconnection leads and the pair of testing leads are formed through the cover insulating therefrom.

At this time, when there is a need to adjust a bias current in a semiconductor device, bias resistors for the semiconductor device are constructed from a main bias resistor that is required to have a high power-withstanding capability, and a trimming bias resistor that is not required to have a high power-withstanding capability, and the main bias resistor is accommodated inside the enclosure while the trimming bias resistor is mounted on the integrated circuit substrate outside the enclosure.

Preferably, an electrode on which a chip component for adjustment is mounted is formed to have a projecting electrode portion, other than a component mounting portion, projecting in such a manner as to approach the other electrode on which the chip component is mounted.

According to the present invention, the semiconductor devices to be integrated in the hybrid integrated circuit module are accommodated inside the hermetically sealed enclosure disposed on the heat-sinking substrate, and to match this configuration, the interconnection leads are formed through the cover to electrically connect the circuit in the enclosure with the outer circuit. At this time, bias resistors for a semiconductor device are constructed from a main bias resistor that is required to have a high power-withstanding capability, and a trimming bias resistor that is not required to have a high power withstanding capability, and the main bias resistor is accommodated inside the enclosure while the trimming bias resistor is mounted on the integrated circuit substrate outside the enclosure.

In this way, according to the present invention, only the semiconductor devices accomodated in the enclosure are sealed instead of sealing the entire hybrid integrated circuit, therefore, by forming the cover from a metallic material or the like, sufficient hermeticity can be accomplished by sealing the cover by soldering, thus making it possible to prevent degradation of the semiconductor device performance, thereby attaining high reliability.

In this construction, to cope with the large heat generation from the bias resistors provided for the semiconductor devices, the main bias resistor that can generate a large amount of heat is mounted inside the enclosure formed in contact with the heat-sinking substrate, thereby accomplishing the dissipation of the heat; on the other hand, the trimming bias resistor that does not generate much heat is mounted on the integrated circuit substrate outside the enclosure, to permit the adjustment of the bias current.

The above construction also allows the use of a glass epoxy-based integrated circuit substrate that has low thermal conductivity, which in turn improves the soldering performance and contributes to increased mass production efficiency. Furthermore, since the glass epoxy-based integrated circuit substrate is by itself inexpensive and allows the formation of the interconnection pattern by copper plating, the construction is inexpensive to manufacture.

Furthermore, in the integrated circuit module of the present invention, the electrodes on which chip components provided for bias current adjustment for semiconductor devices are mounted and the electrodes on which chip components provided for impedance matching adjustment are mounted are each formed to have a projecting electrode portion, other than a component mounting portion, projecting in such a manner as to approach the other electrode on which the same chip component is mounted; therefore, when there arises a need to replace any of these chip components, the projecting electrode portion can be heated simultaneously with the other electrode using an ordinary soldering iron, which greatly facilitates chip component replacement and thus serves to increase the mass production efficiency.

As described, according to the present invention, a novel integrated circuit module which has high reliability, is well suited for mass production and is inexpensive to manufacture, can be realized.

BRIEF DESCRIPTION OF THE DRAWINGS

The present invention will be more clearly understood from the description as set forth below with reference to the accompanying drawings, wherein:

FIG. 6 is a plan view showing one embodiment of a component arrangement mounted on a substrate of the hybrid integrated circuit module of FIG. 5A;

DESCRIPTION OF THE PREFERRED EMBODIMENTS

Before describing the preferred embodiments, an explanation will be given of the conventional hybrid integrated circuit module shown in FIGS. 1A to 2.

Figure 1A:
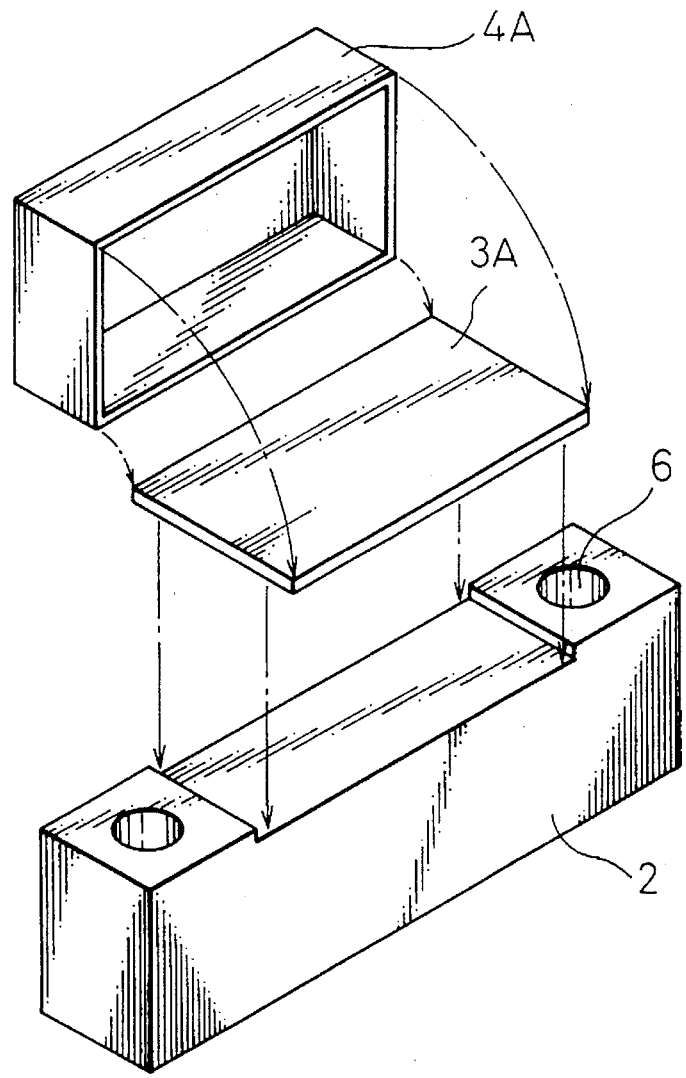
FIG. 1A is an exploded perspective view showing the construction of a prior art hybrid integrated circuit-module.

FIG. 1A is an exploded perspective view showing the construction of a prior art hybrid integrated circuit module.

In FIG. 1A, reference 2 denotes a heat-sinking body, 3A denotes a hybrid integrated circuit substrate made of alumina, 4A denotes a plastic cover of the hybrid integrated circuit substrate 3A, and 6 denotes a mounting hole. The hybrid integrated circuit substrate 3A made of alumina is mounted on the heat-sinking body 2, and it is covered by the plastic cover 4A.

Figure 1B:
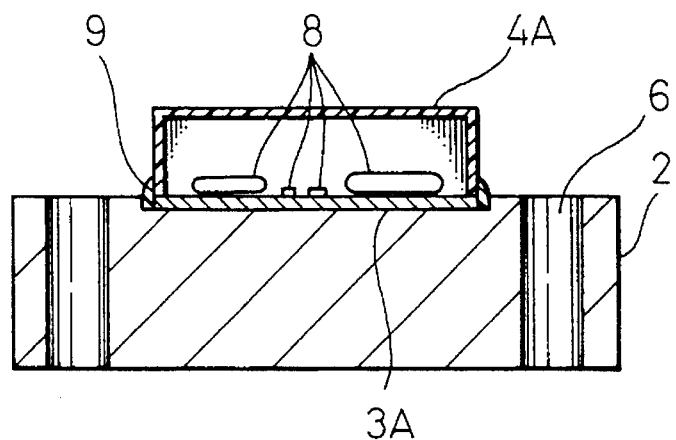
FIG. 1B is a vertical sectional view showing the construction of a prior art hybrid integrated circuit module.

FIG. 1B is a vertical sectional view showing the construction of a prior art hybrid integrated circuit module of FIG. 1A. Circuit components are mounted on the alumina substrate 3A, and the entire hybrid integrated circuit is covered with the plastic cover 4A, which is then sealed with a resin 9 for enhanced reliability.

However, the construction that involves covering the entire hybrid integrated circuit with plastic cover 4A and sealing it with a resin 9, as in the prior art, has the problem of degradation of the semiconductor device reliability in the long term because of insufficient hermeticity.

Further, when the substrate of the hybrid integrated circuit is made of alumina which has a good thermal conductivity, it is surely advantageous for sinking the heat generated by the circuit components mounted on the substrate. However, not only is the alumina substrate itself expensive, but the interconnection pattern has to be formed by gold plating, thereby making the hybrid integrated circuit module very expensive to manufacture.

Figure 2:
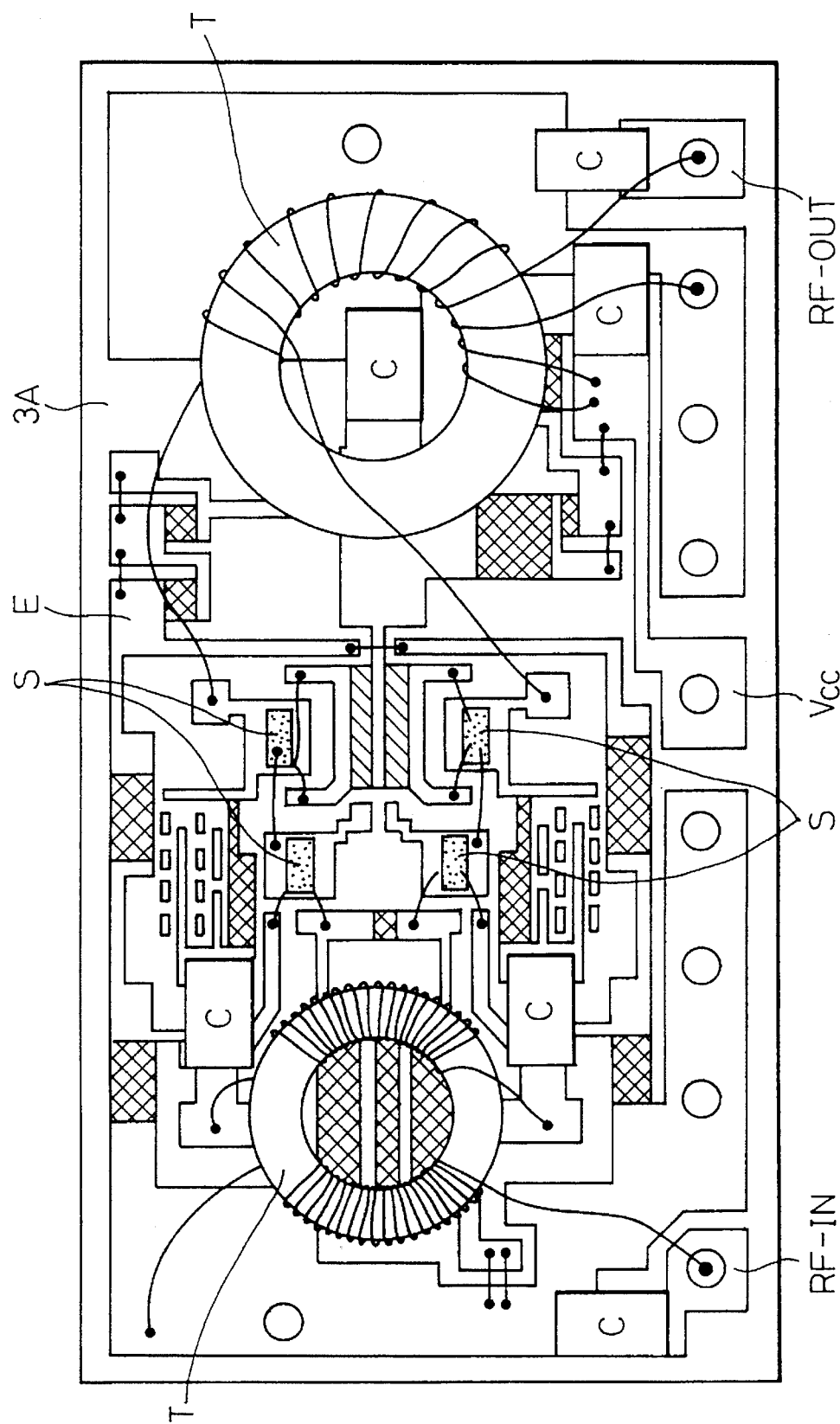
FIG. 2 is a top plan view illustrating electrical parts on a circuit board of a prior art.

FIG. 2 is a top plan view illustrating electrical parts on a substrate 3A of the prior art. In FIG. 2, C denotes chip capacitors, E denotes an electrode, S denotes semiconductor devices, such as Si transistors and GaAs FETs, T denotes transformers, and cross hatching denotes thin-film resistors. As shown in FIG. 2, in the prior art hybrid integrated circuit module, electrodes, to which circuit components are mounted, are formed in the shapes that match the shapes of the individual circuit components.

However, the construction that involves forming the electrodes, to which the circuit components are attached, in the shapes that match the shapes of the individual circuit components, as in the prior art, has the problem that mass production efficiency is reduced since chip components are then difficult to remove.

That is, when it becomes necessary to replace a mounted resistance-adjusting chips component, etc. because it does not provide the prescribed resistance value, etc., for example, the mounting portions of the chip component are heated and the solder melted using a soldering iron. The problem here is that heating the two portions at the same time is not an easy job, hence the difficulty in removing the chip component.

Figure 3A:
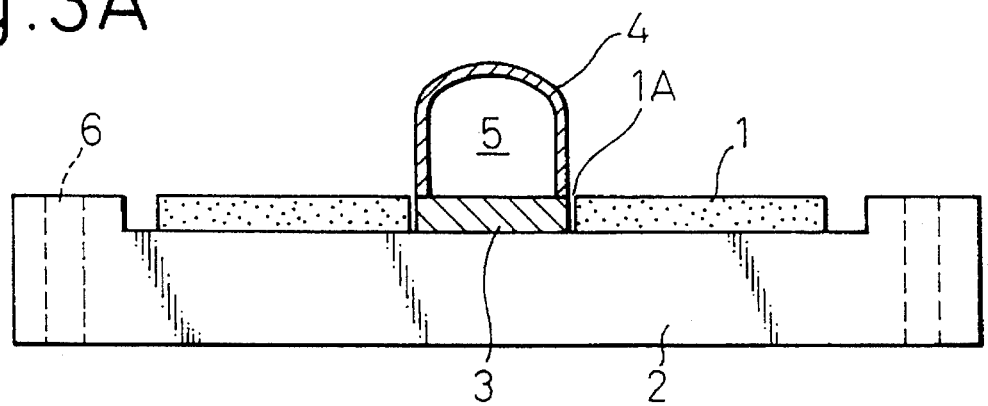
FIG. 3A is a side elevational view, partly in cross section, showing the basic construction of a hybrid integrated circuit module according to the present invention.
Figure 3B:
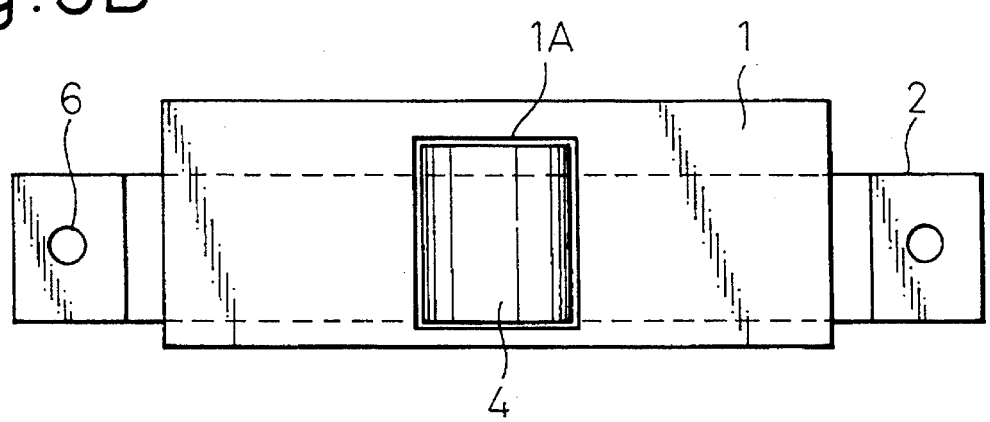
FIG. 3B is a plan view of the hybrid integrated circuit module shown in FIG. 3A.

FIG. 3A and 3B show a basic construction of the hybrid integrated circuit module according to the present invention. FIG. 3A is a side elevation view, partly in cross section, and FIG. 3B is a top plan view of the hybrid integrated circuit module shown in FIG. 3A;

As shown in the FIGS. 3A and 3B, the hybrid integrated circuit module of the invention is comprised of a hybrid integrated circuit substrate 1, a heat-sinking substrate 2, a base plate 3, and a cover 4, and the base plate 3 and the cover 4 together form an enclosure 5. The hybrid integrated circuit substrate 1 is made of a glass epoxy-based material and is bonded onto the heat-sinking substrate 2 made of aluminum or the like. A center portion of the hybrid integrated circuit substrate 1 is cut out to provide an opening 1A. The base plate 3 made of a material having high thermal/electrical conductivity, such as a Kovar (Fe—Ni—Cr—Co alloy), is bonded to the heat-sinking substrate 2 through the opening 1A. The cover 4 is made of the same material as the base plate and is bonded, by soldering, to seal the top space of the base plate 3 and to provide grounding.

In the above construction, the cover 4 and the base plate 3 are bonded together for sealing in an nitrogen atmosphere, and the base plate 3 and cover 4 together form an enclosure 5 in which a nitrogen gas is hermetically sealed. In the figure, the numeral 6 indicates a mounting hole formed through the heat-sinking substrate 2.

Figure 3C:
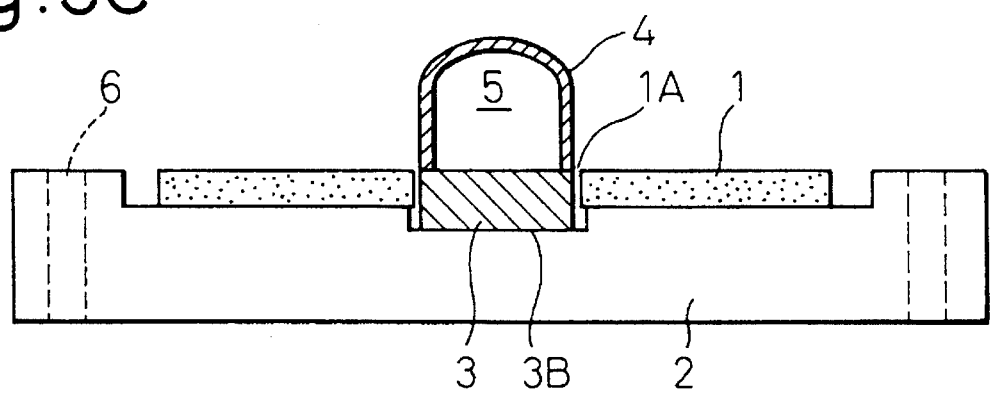
FIG. 3C is a side elevational view, partly in cross section, showing a modified construction of the hybrid integrated circuit module of FIG. 3A.

FIG. 3C shows a modified construction of the hybrid integrated circuit module of FIG. 3A. In this embodiment, a shallow ditch 3B is formed on the heat-sinking substrate 2.

Figure 4:
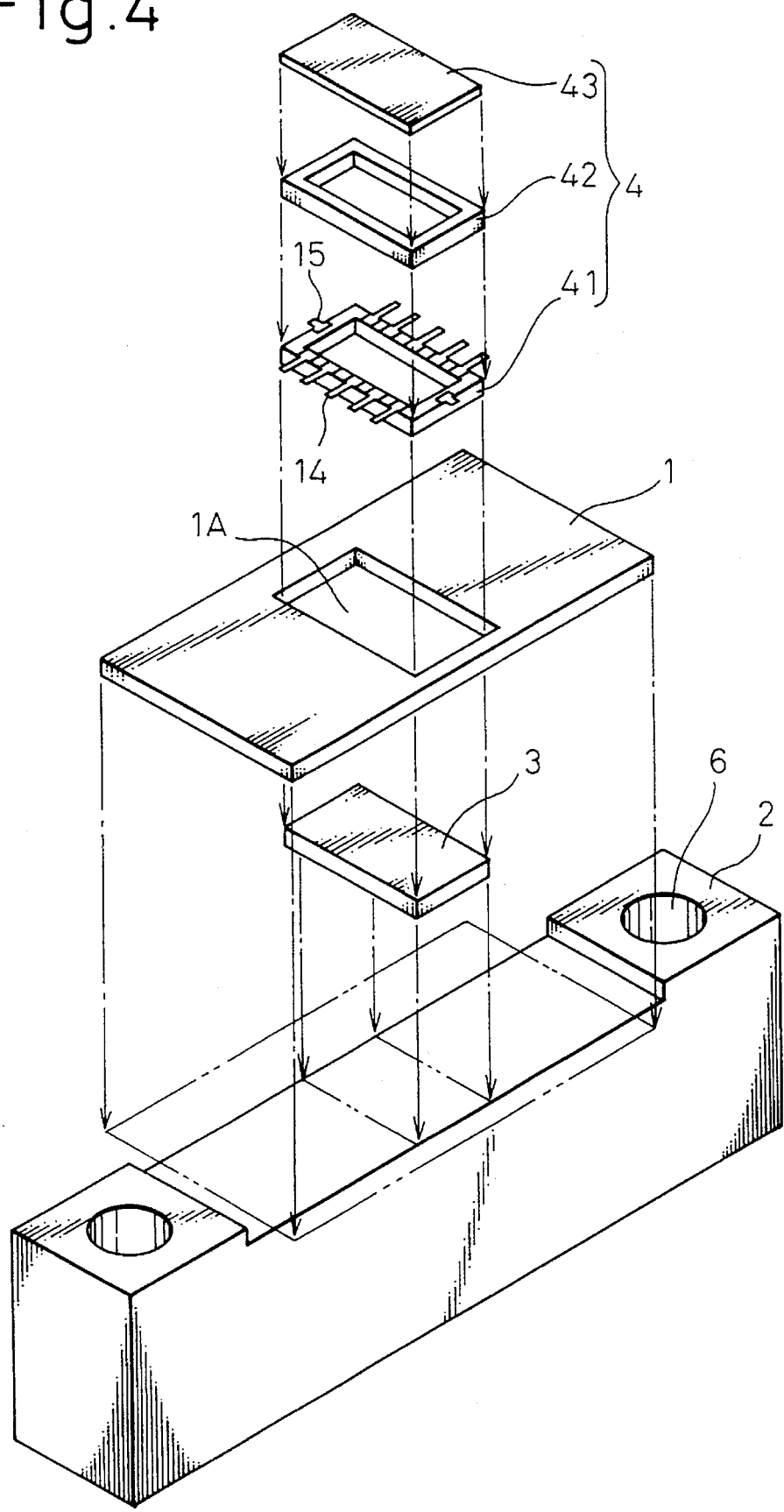
FIG. 4 is an exploded perspective view showing the construction of one example of a hybrid integrated circuit module according to the present invention.

FIG. 4 is an exploded perspective view showing the construction of one example of a hybrid integrated circuit module according to the present invention. The hybrid integrated circuit module of this embodiment is comprised of a hybrid integrated circuit substrate 1 having an opening 1A at the center portion thereof, a heat-sinking substrate 2 having mounting holes 6, a base plate 3 made of a Kovar, a first enclosure wall 41, a second enclosure wall 42, and an enclosure lid 43. The hybrid integrated circuit substrate 1 is made of a glass epoxy-based material and is bonded onto the heat-sinking substrate 2 made of aluminum or the like. The base plate 3 having high thermal and electrical conductivities is bonded to the heat-sinking substrate 2 through the opening 1A. The cover 4 is comprised of the first wall 41, the second wall 42, and the lid 43 which are made of the same material as the base plate. The first wall 41, the second wall 42, and the lid 43 are stacked on the base plate 3 and are connected by soldering to seal the top of the base plate 3 and to form an enclosure 5 therein.

Figure 5A:
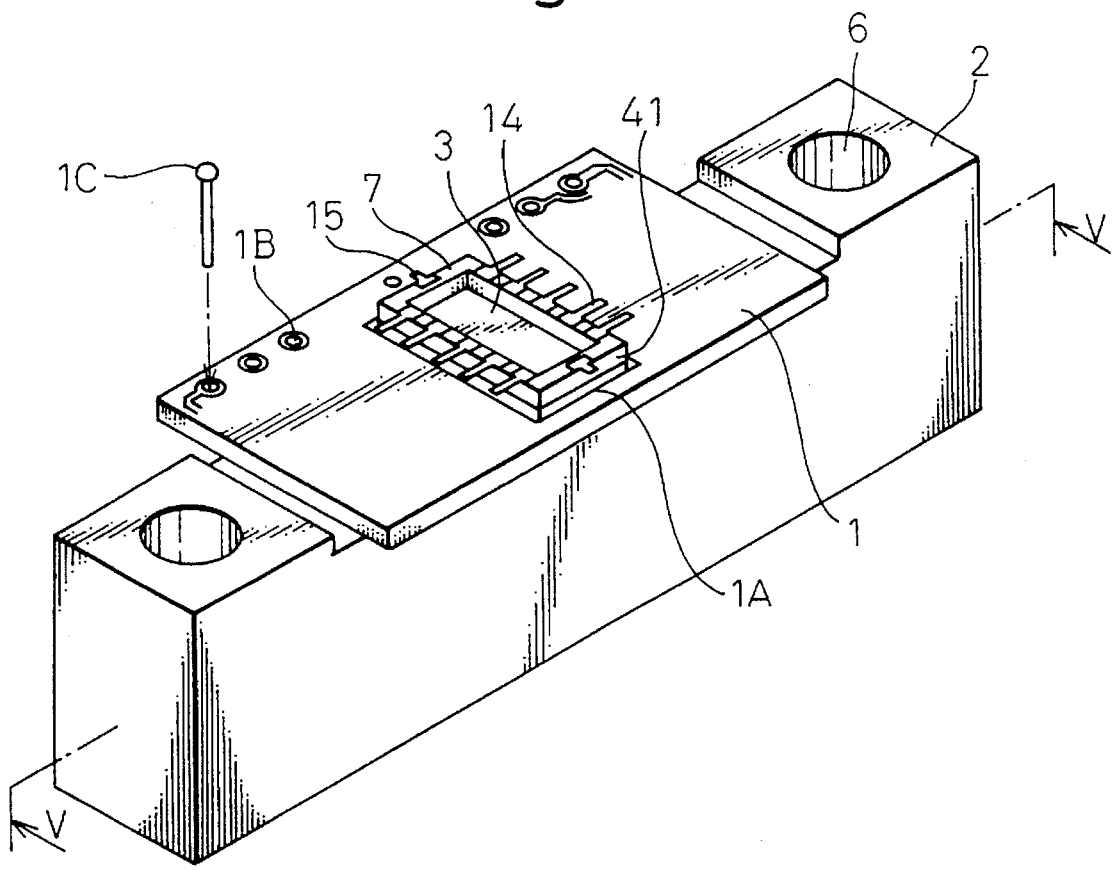
FIG. 5A is a perspective view showing the construction of the hybrid integrated circuit module of FIG. 5A with certain parts omitted.
Figure 5B:
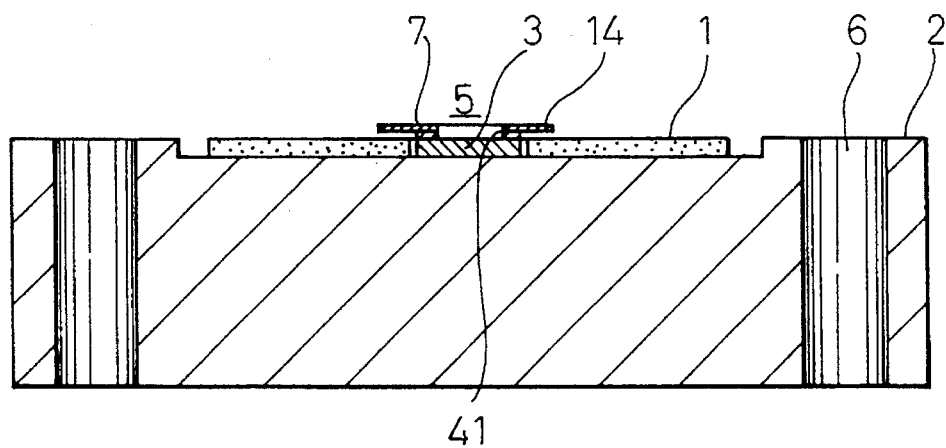
FIG. 5B is a vertical sectional view taken in the direction of the arrows substantially along the line V—V of FIG. 5A.

FIG. 5A is a perspective view showing the construction of the-hybrid integrated circuit module of FIG. 5A wherein the second wall 42 and the lid 43 are omitted, and FIG. 5B is a vertical sectional view taken in the direction of the arrows substantially along the line V—V of FIG. 5A. Interconnection leads 14 and 15 for electrically connecting the enclosure 5 and the outside thereof. Circuit components which generate heat are arranged on the-base plate 3. Through holes 1B for attaching pins 1C are provided on an edge portion of the hybrid integrated circuit substrate 1.

FIG. 6 shows one embodiment of component arrangement mounted on a substrate of the hybrid integrated circuit module of FIG. 5A. In Fig.6, the portion 7 indicates a joint face on the first wall 41 as illustrated in FIG. 5A and 5B.

According to this embodiment, all the semiconductor devices 10, 11, 12, 13 for the hybrid integrated circuit substrate 1 are accommodated inside the enclosure 5. A plurality of interconnection leads 14 are provided on the joint face 7 of the first wall 41 for signal transfer between the semiconductor devices 10, 11, 12, 13 and other circuit components mounted on the substrate 1, and a pair of interconnection leads 15 are also provided on the joint face 7 of the first wall 41 to enable test operating voltages from the semiconductor devices 10, 11, 12, 13 to be tested from outside the enclosure 5. These interconnection leads 14 and 15 are electrically insulated from the enclosure 5.

Thus, the hybrid integrated circuit substrate 1 shown in FIG. 6 is characterized in that all the semiconductor devices 10, 11, 12, 13 mounted on the hybrid integrated circuit substrate 1 are accommodated inside the enclosure 5, while other circuit components, such as a signal divider 16, a signal combiner 17, and impedance converters 18, 19, are mounted on the hybrid integrated circuit 1.

In accordance with the above construction, the hybrid integrated circuit module of the present invention that contains the hybrid integrated circuit substrate 1 shown in FIG. 6 is constructed to seal only the semiconductor devices 10, 11, 12, and 13. That is, the entire hybrid integrated circuit is not sealed according to the present invention. Therefore, sufficient hermeticity can be accomplished by constructing the enclosure 5 from a metallic material or the like, thus making it possible to prevent degradation of the characteristics of the semiconductor devices 10, 11, 12, and 13, thereby attaining high reliability.

Further, since the hybrid integrated circuit substrate 1 is constructed using an inexpensive glass epoxy-based material that allows the interconnection pattern to be formed by copper plating, the construction is inexpensive to manufacture.

Figure 7:
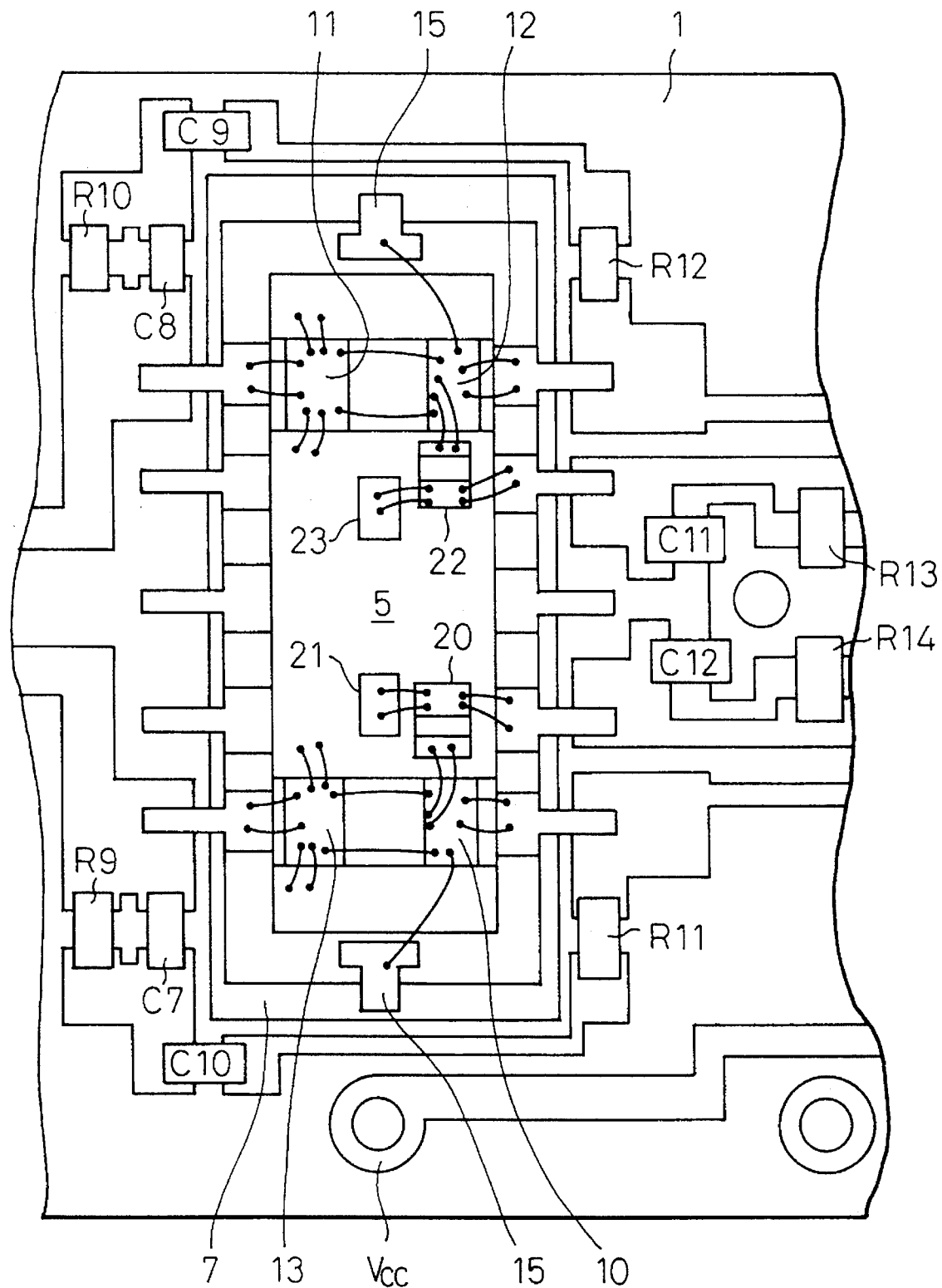
FIG. 7 is an enlarged partial plan view showing a modified embodiment of a component arrangement on the enclosure of FIG. 6.

FIG. 7 shows a modified embodiment of the component arrangement on the enclosure 5. The hybrid integrated circuit substrate 1 in this embodiment shown in FIG. 7 has the following features:

(1) All the semiconductor devices 10, 11, 12, and 13 mounted on the hybrid integrated circuit substrate 1 are accommodated inside the enclosure 5;

(2) A bias resistor 20 and a grounding capacitor 21 for the semiconductor device 10 are disposed inside the enclosure 5 in close proximity to the semiconductor device 10; and (3) A bias resistor 22 and a grounding capacitor 23 for the semiconductor device 12 are disposed inside the enclosure 5 in close proximity to the semiconductor device 12.

Figure 9A:
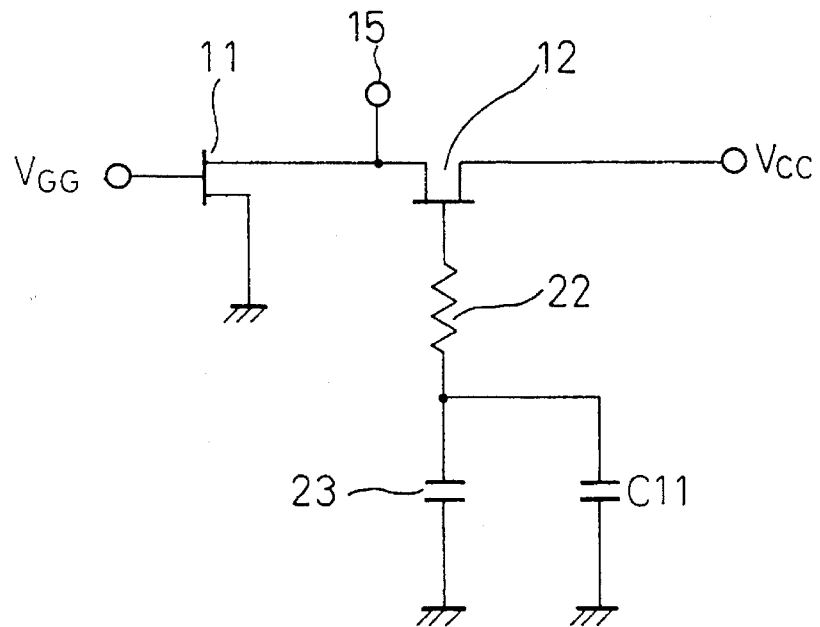
FIG. 9A is a partial circuit diagram of the component mounted on the enclosure of FIG. 7.

FIG. 9A is a partial circuit diagram of the component mounted on the enclosure 5 of FIG. 7.

The above construction prevents the formation of parasitic capacitance and inductance, and therefore, ensures the proper performance of the semiconductor devices 10 and 12.

Figure 8:
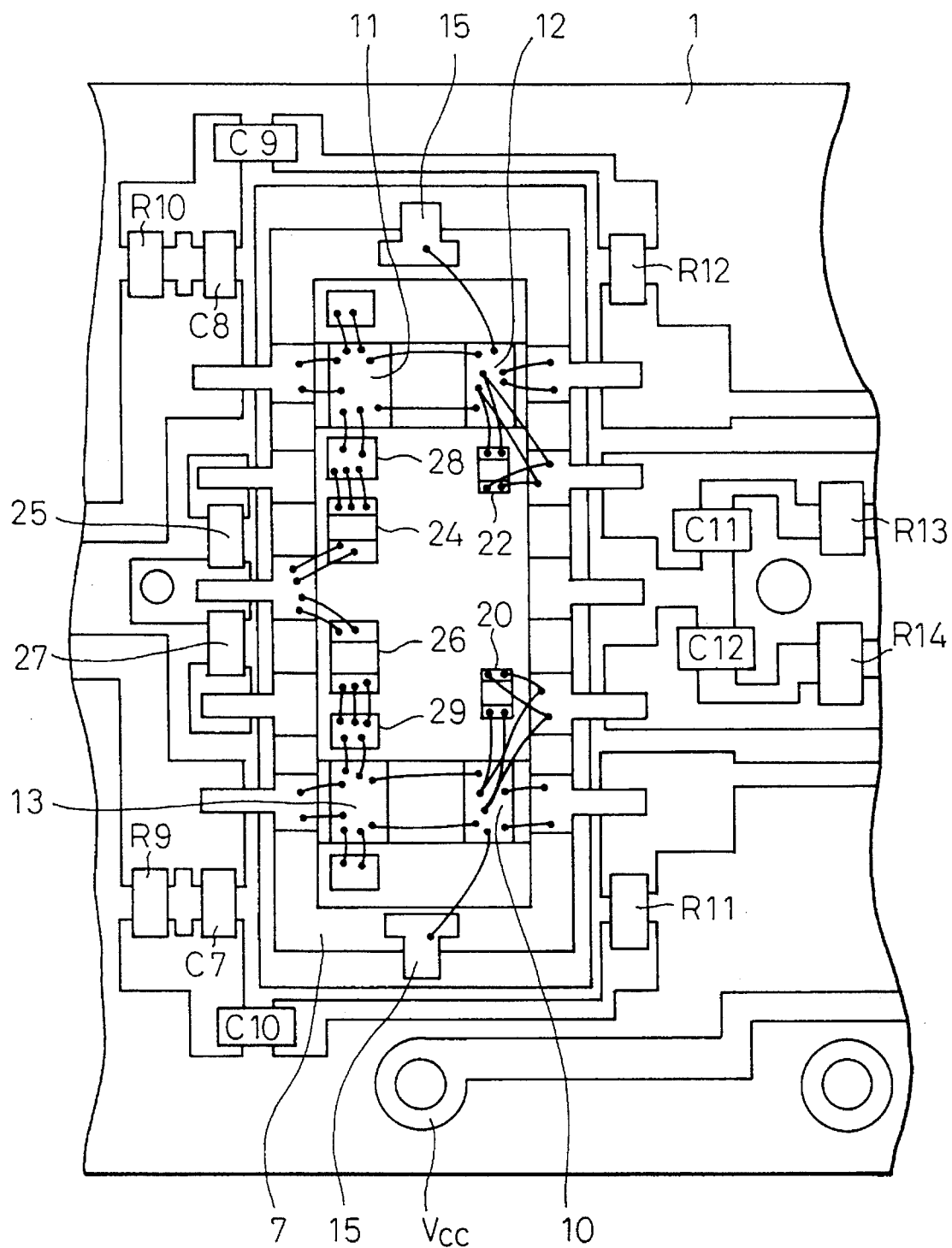
FIG. 8 is an enlarged partial plan view showing another modified embodiment of component arrangement on the enclosure of FIG. 6.

FIG. 8 shows another modified embodiment of component arrangement mounted on the enclosure portion of FIG. 6. The hybrid integrated circuit substrate 1 in this embodiment shown in FIG. 8 has the following features:

(1) All the semiconductor devices 10, 11, 12, and 13 mounted on the hybrid integrated circuit substrate 1 are accommodated inside the enclosure 5;

(2) The bias resistors provided for the semiconductor device 11, including the bias resistor 24 of which a high voltage withstanding capability is required, are disposed inside the enclosure 5;

(3) The trimming bias resistor 25 of which a high voltage-withstanding capability is not required is disposed outside the enclosure 5;

(4) The bias resistors provided for the semiconductor device 13, including the bias resistor 26 of which a high voltage withstanding capability is required, are disposed inside the enclosure 5; and (5) The trimming bias resistor 27 of which a high voltage withstanding capability is not required is disposed outside the enclosure 5.

Figure 9B:
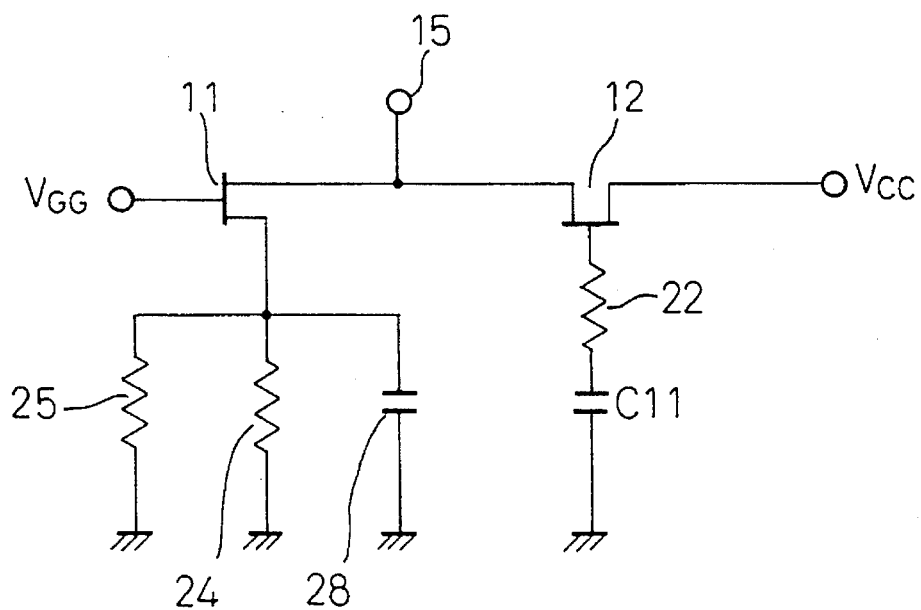
FIG. 9B is a partial circuit diagram of the component mounted on the enclosure of FIG. 8.

In FIG. 8, reference 28 denotes a grounding capacitor for the semiconductor device 11, disposed inside the enclosure 5, and 29 denotes a grounding capacitor for the semiconductor device 13, also disposed inside the enclosure 5. FIG. 9B is a partial circuit diagram of the components mounted on the enclosure 5 of FIG. 8.

This construction allows the large amount of heat generated by the bias resistors 24 and 26 to be conducted to the heat-sinking Substrate 2 (not shown in FIG. 8) via the enclosure 5, thus achieving the cooling of the-bias resistors 24 and 26, while permitting the adjustment of the bias current with the trimming bias resistors 25 and 27 disposed outside the enclosure 5.

In the hybrid integrated circuit module, as can be seen from the embodiment shown in FIG. 8, chip resistors, chip capacitors, or chip inductors, once soldered, may be removed for replacement for bias current or impedance matching adjustment.

Figure 10A:
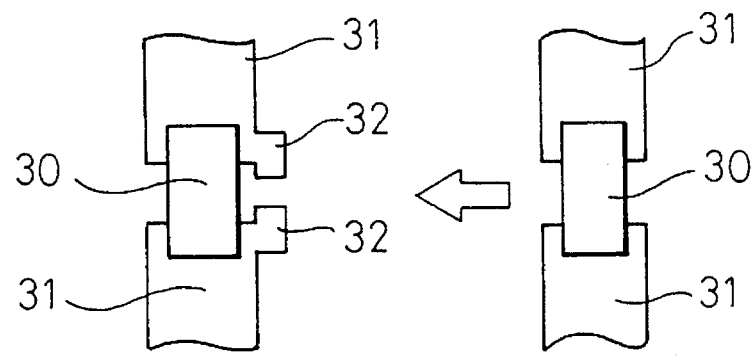
FIG. 10A shows partial plan views showing a conventional electrode configuration and one example of an improved electrode configuration according to the present invention.
Figure 10B:
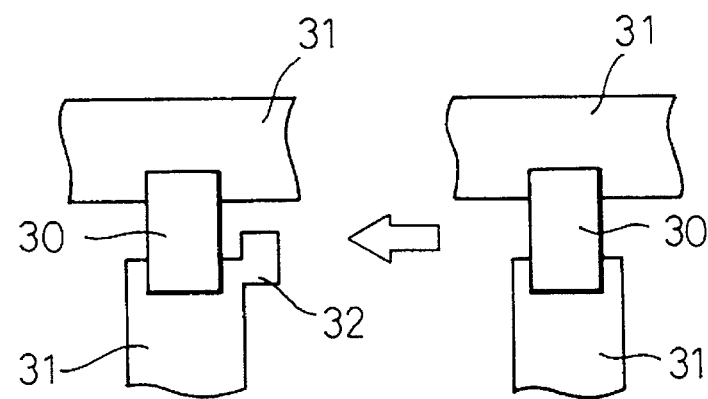
FIG. 10B shows partial plan views showing a conventional electrode configuration and another example of an improved electrode configuration according to the present invention.

In the present invention, to facilitate such replacement work, an electrode 31, on which a chip component 30 for adjustment is mounted, is formed to have a projecting electrode portion 32 as shown in FIGS. 10A and 10B. The projecting electrode portion 32 is formed at least for one electrode 31 in such a manner as to approach the other electrode 31 on which the same chip component 30 is mounted. In FIGS. 10A and 10B, a conventional electrode configuration is shown on the right side and an example of improved electrode configuration according to the present invention is shown on the left side.

Figure 11A:
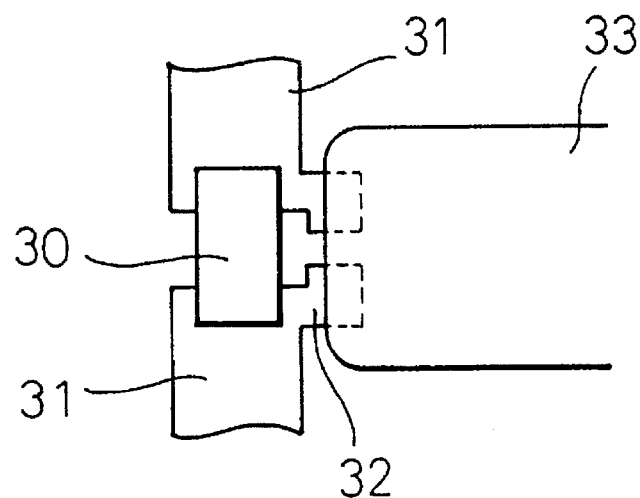
FIG. 11A is a partial plan view showing a replacement process for chip component mounted on the electrode of FIG. 10A.
Figure 11B:
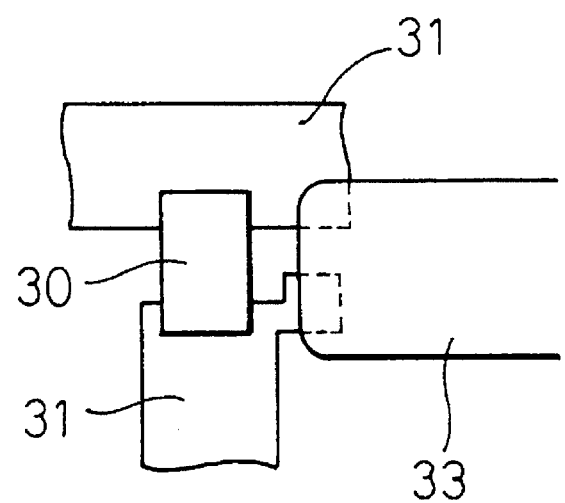
FIG. 11B is a partial plan view showing a replacement process for chip component mounted on the electrode of FIG. 10B.

According to this construction, when the chip component 30 for adjustment needs replacing, a pair of projecting electrode portion 32 (as shown in FIG. 11A) or the projecting electrode portion 32 and the nearest electrode 31 (as shown in FIG. 11B) are heated together by a soldering iron 33. As a result, the solder is melted by the heat conducted via the projecting electrode portion 32 and the chip component 30 can be easily removed.

Figure 12:
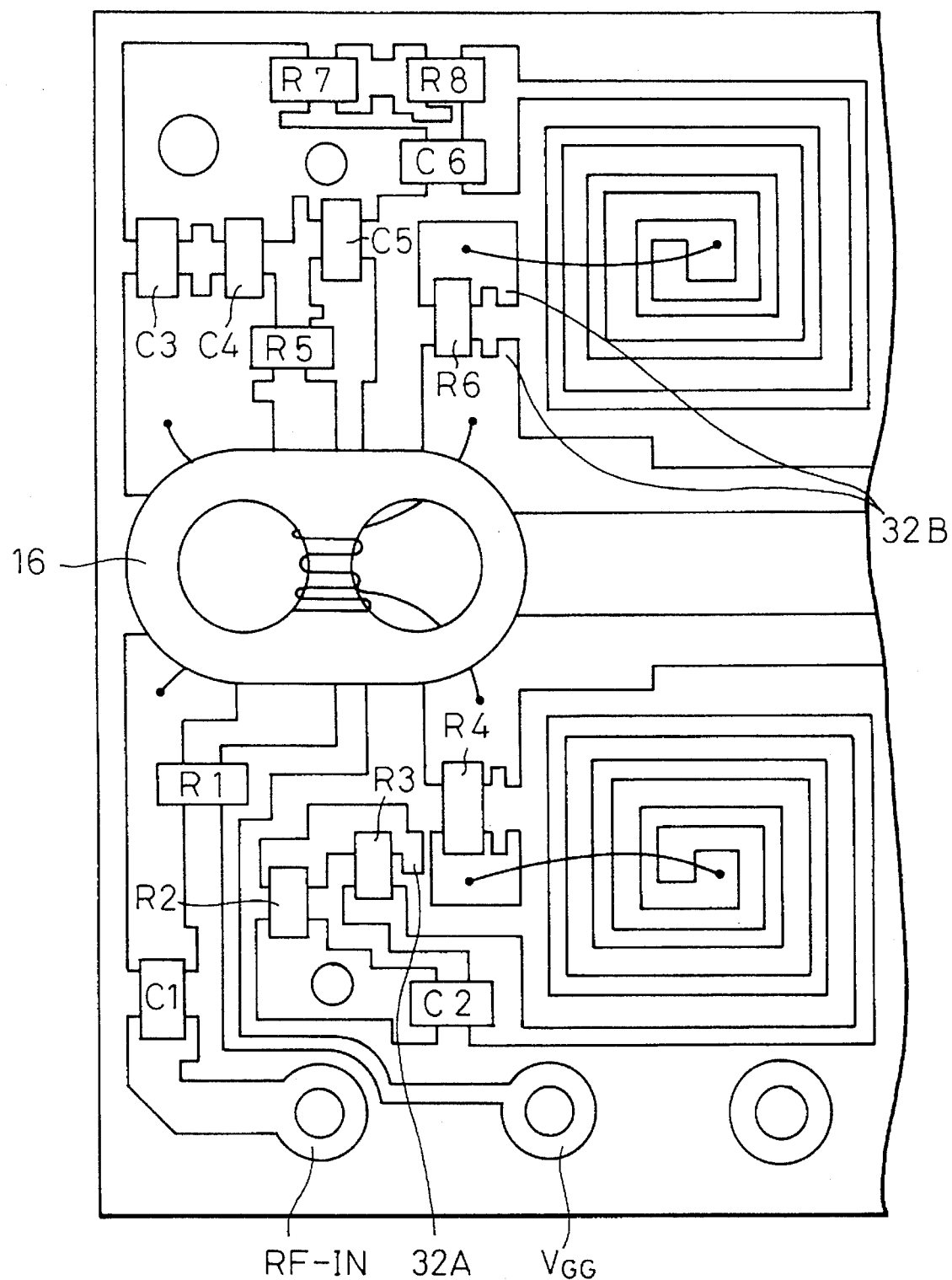
FIG. 12 is a partial plan view of the left side of the substrate of the hybrid integrated circuit module of FIG. 6 showing the improved electrode configuration according to the present invention.
Figure 13:
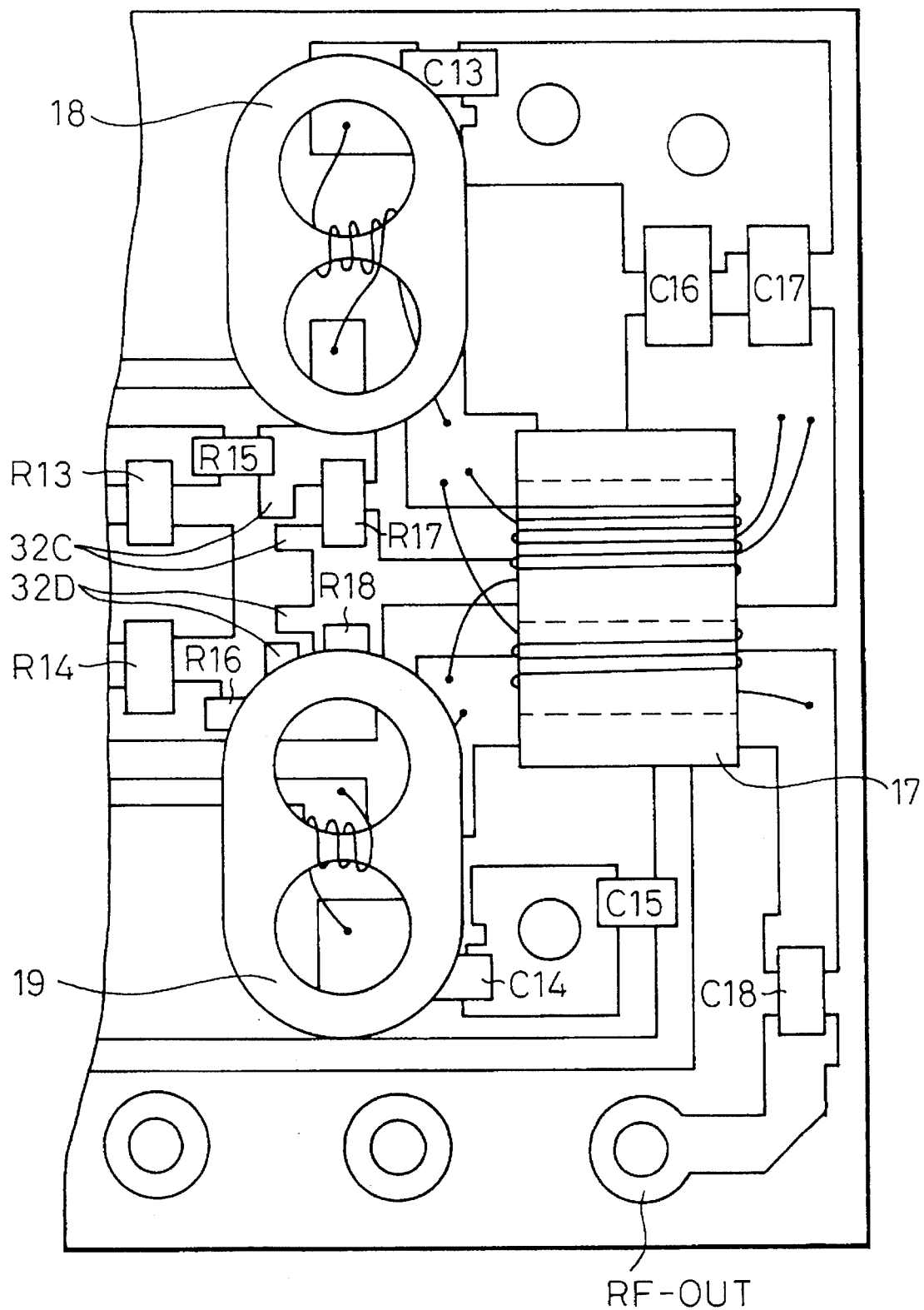
FIG. 13 is a partial plan view of the right side of the substrate of the hybrid integrated circuit module of FIG. 6 showing the improved electrode configuration according to the present invention.

In a specific example, if resistor R3, resistor R6, resistor R17, and resistor R18 are designated parts for adjustment in the substrate construction shown in FIGS. 12 and 13, for example, each of the electrodes 31 on which the resistor R3, resistor R6, resistor R17, and resistor R18 are mounted is formed to have a projecting electrode portion as shown by references 32A and 32B in FIG. 12 and by references 32C and 32D in FIG. 13. These projecting electrode portion 32A to 32D are formed in such a manner as to approach the other electrode 31 on which the same chip component 30 is mounted.

Figure 14:
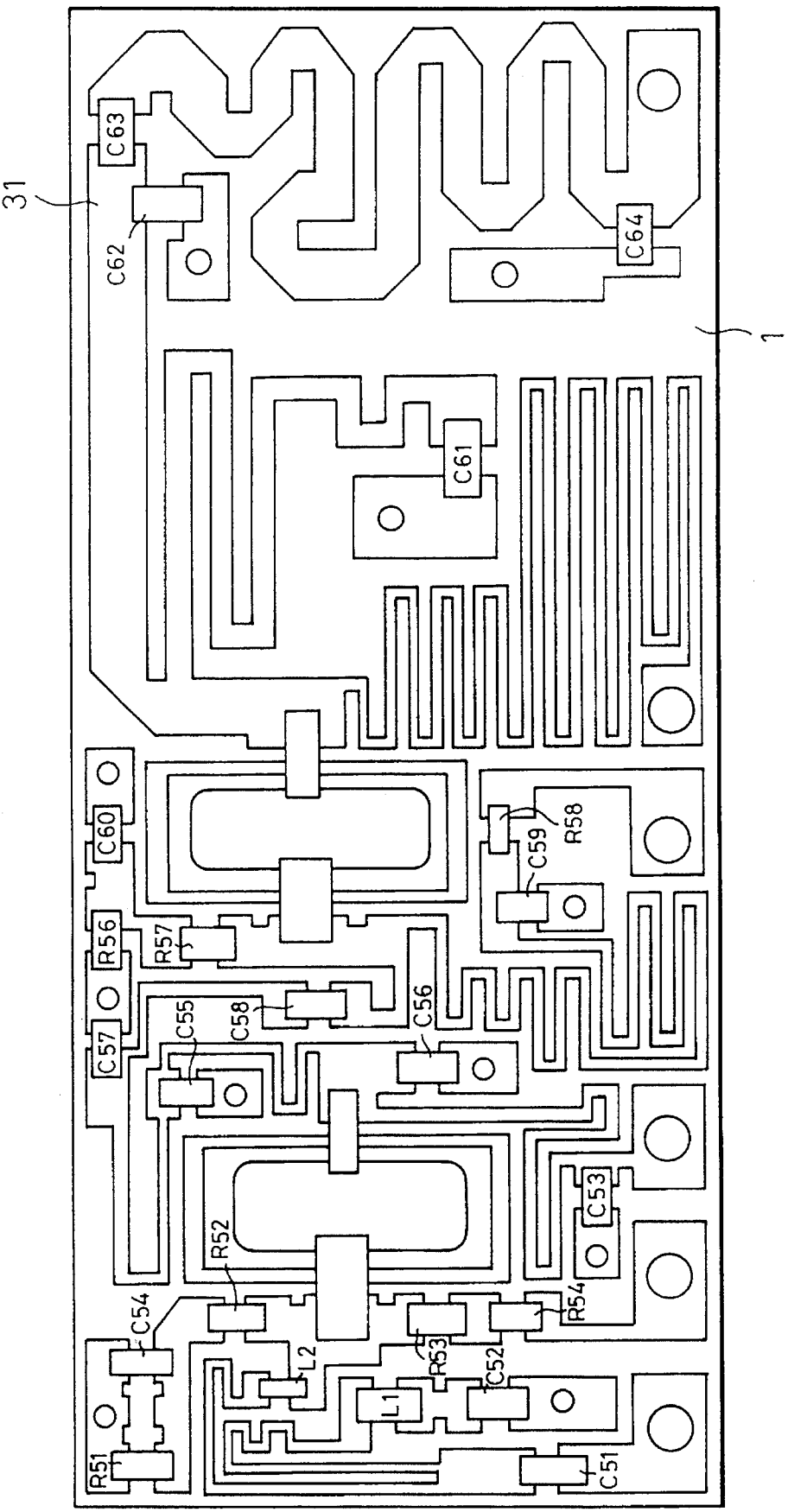
FIG. 14 is a plan view of the substrate of the hybrid integrated circuit module showing a conventional electrode configuration.

FIG. 14 is a substrate of the hybrid integrated circuit module showing a prior art electrode configuration. In the prior art illustrate FIG. 14, electrodes 31 are formed to match the shapes of chip components. For example, the electrode 31 around a chip inductor L2, chip resistors R54 and R58, and a chip capacitor C62 are formed in square shapes to match the shapes of the chip components.

Figure 15A:
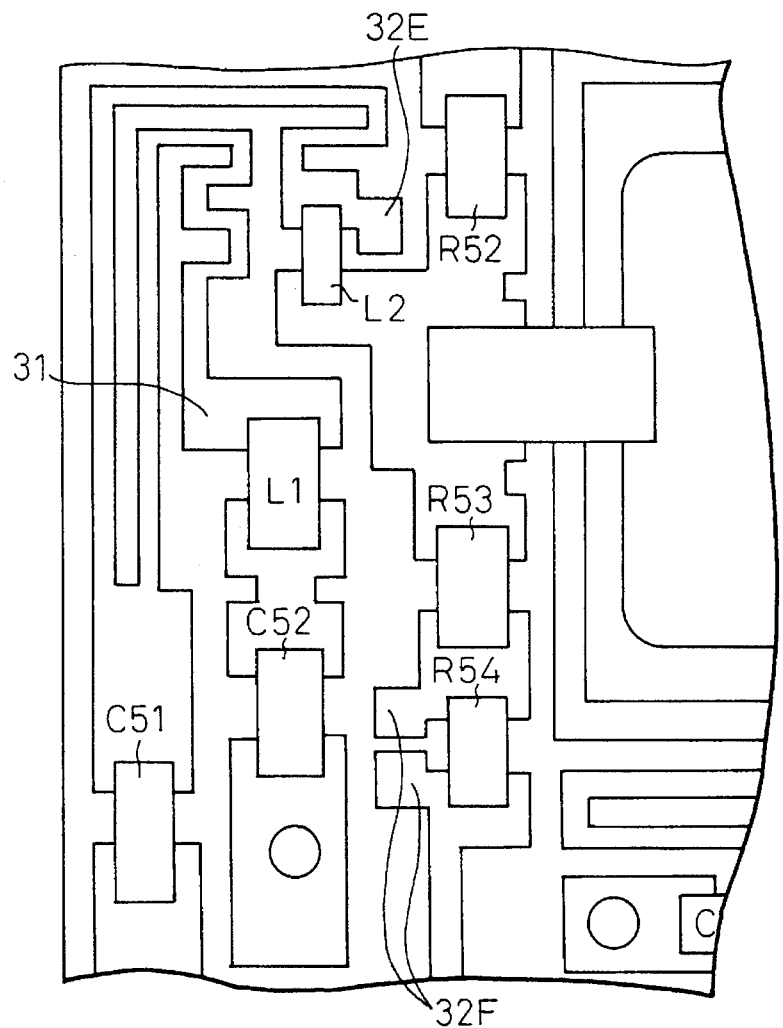
FIG. 15A is a partial plan view of the left upper part of the substrate of FIG. 6 showing the improved electrode configuration according to the present invention.
Figure 15B:
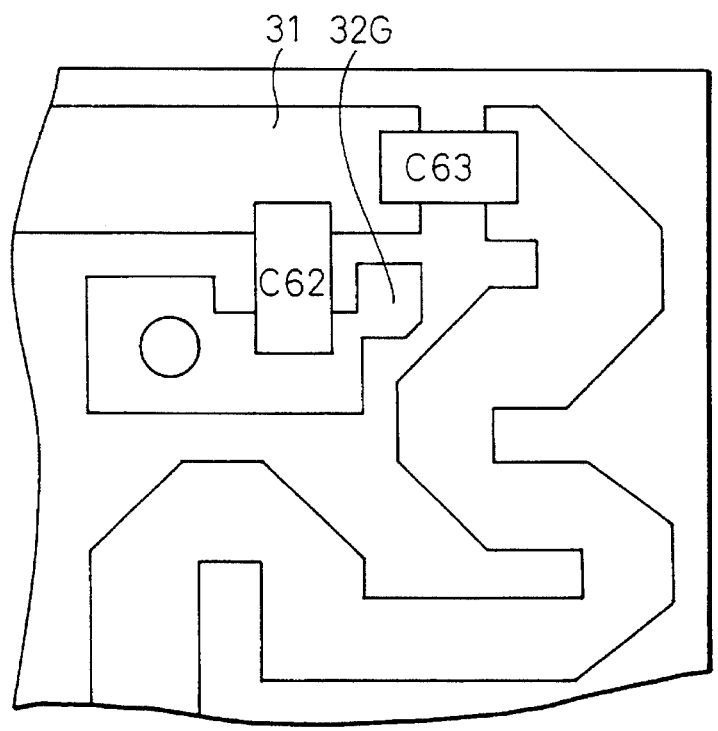
FIG. 15B is a partial plan view of the right upper part of the substrate of FIG. 6 showing the improved electrode configuration according to the present invention.
Figure 15C:
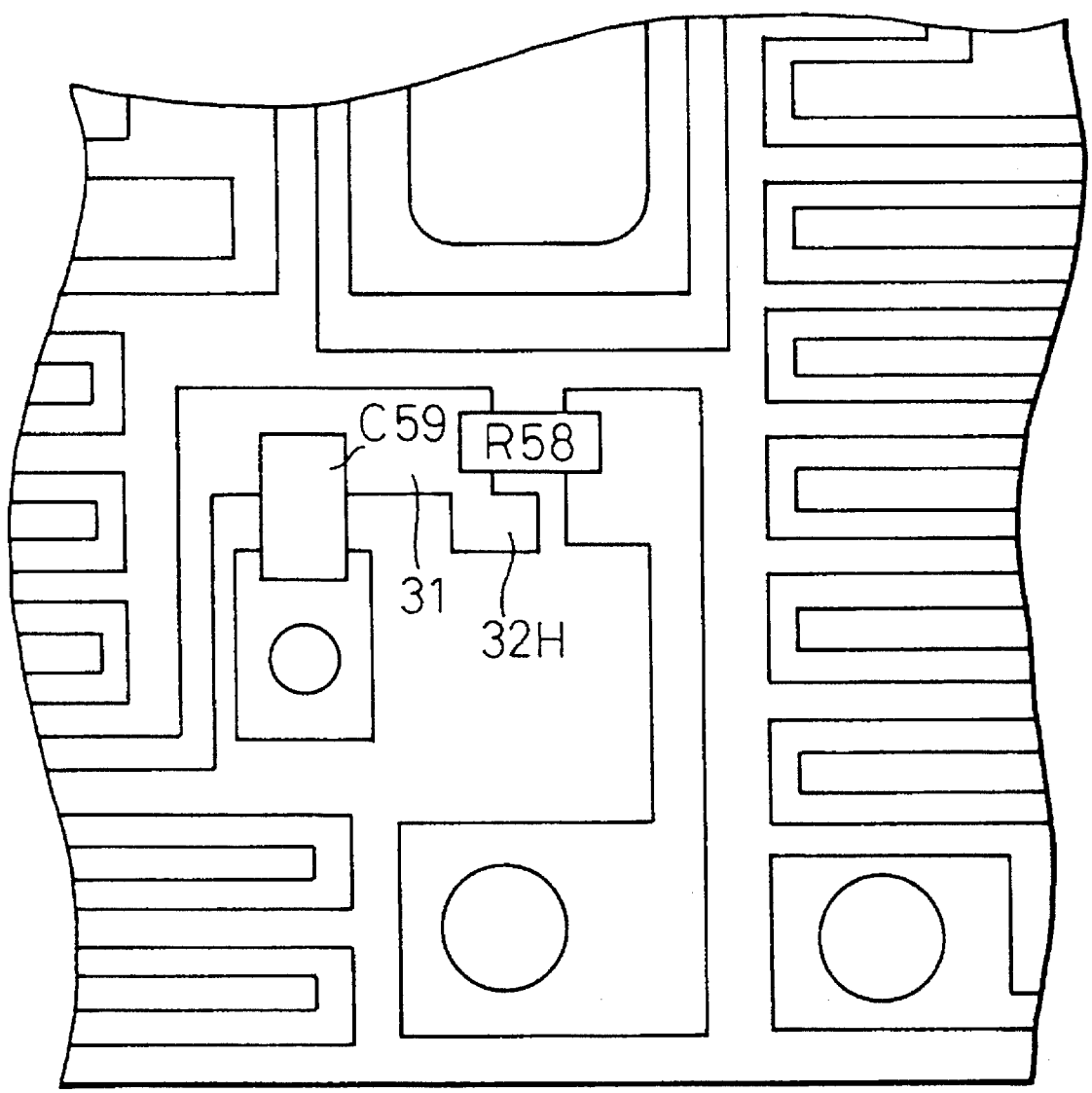
FIG. 15C is a partial plan view of the center lower part of the substrate of FIG. 6 showing the improved electrode configuration according to the present invention.

Contrary to this, in the present invention, if the chip components L2, R54, R58, and C62 are the designated parts for adjustment, for example, each of the electrodes 31, on which the inductance L2, resistor R54, resistor R58, and capacitor C62 are mounted, is formed to have a projecting electrode portions 32E, 32F, 32G, and 32H, as shown in FIGS. 15A, 15B, and 15C. The projecting electrode portion 32E, 32F, 32G, and 32H are formed in such a manner as to approach the other electrode 31 on which the same chip component is mounted.

As described above, according to the present invention, instead of sealing the entire hybrid integrated circuit, only the semiconductor devices to be integrated are sealed; therefore, by forming the enclosure from a metallic material or the like, sufficient hermeticity can be accomplished, thus making it possible to prevent degradation of the semiconductor device performance, thereby attaining high reliability.

In this construction, to cope with the large heat generation by the bias resistors provided for the semiconductor devices, the bias resistors that can generate a large amount of heat are mounted inside the enclosure formed in contact with the heat-sinking substrate, thereby accomplishing the dissipation of the heat; on the other hand, the bias resistors for adjustment that do not generate much heat are mounted on the hybrid integrated circuit substrate outside the enclosure, to permit the adjustment of the bias current.

The above construction also allows the use of a glass epoxy-based hybrid integrated circuit substrate that has low thermal conductivity which in turn improves the soldering performance and contributes to increased mass production efficiency. Furthermore, since the glass epoxy-based hybrid integrated circuit substrate is by itself inexpensive and allows the formation of the interconnection pattern by copper plating, the construction is inexpensive to manufacture.

Furthermore, according to the present invention, replacement of chip components for adjustment is extremely easy, which also contributes to increased volume production efficiency.

Thus, in accordance with the present invention, an integrated circuit module having high reliability, well suited for mass production, and inexpensive to manufacture can be realized.

What is claimed is:

1. A hybrid integrated circuit module, comprising:
    circuit components, including semiconductor devices and chip components;
    a heat-sinking substrate;
    an integrated circuit substrate, bonded onto the heat-sinking substrate and mounting the chip components;
    a base plate, having a high thermal conductivity, bonded onto the heat-sinking substrate and mounting the semiconductor devices;
    a hollow cover covering a space above the base plate to make an enclosure between the base plate and the cover;
    a sealing means sealing a joint face between the base plate and the cover to hermetically seal the enclosure;
    a plurality of interconnection leads extending through the cover for electrically connecting a circuit on the base plate and a circuit on the substrate;
    a pair of interconnection leads extending through the cover for testing operating signals in the semiconductor devices; and
    bias resistors, including a main bias resistor having a high power-withstanding capability and a trimming bias resistor that is not required to have a high power-withstanding capability, the main bias resistor being accommodated inside the enclosure and the trimming bias resistor being mounted on the integrated circuit substrate outside the enclosure.

2. A hybrid integrated circuit module as set forth in claim 1, wherein:
    the substrate has an opening at the center thereof and the base plate is positioned in the opening without contacting the edge of the opening.

3. A hybrid integrated circuit module as set forth in claim 1, wherein:
    a bias resistor and a grounding capacitor for a semiconductor device are disposed inside the enclosure in close proximity to the semiconductor device.

4. A hybrid integrated circuit module as set forth in claim 1, wherein:
    at least one electrode on which a particular chip component is mounted includes a projecting electrode portion approaching the other electrode on which the same chip component is mounted.

5. A hybrid integrated circuit module as set forth in claim 2, wherein:
    a grounding capacitor is disposed inside the enclosure.

6. A hybrid integrated circuit module as set forth in claim 2, wherein:
    said bias resistors, consisting of said main bias resistor that is required to have a high power-withstanding capability and said trimming bias resistor that is not required to have a high power-withstanding capability, said main bias resistor being accommodated inside the enclosure and the trimming bias resistor mounted on the integrated circuit substrate outside the enclosure.

7. A hybrid integrated circuit module as set forth in claim 2, wherein:
    at least one electrode on which a particular chip component is mounted includes a projecting electrode portion approaching the other electrode on which the same chip component is mounted.

8. A hybrid integrated circuit module as set forth in claim 3, wherein:
    said bias resistors consisting of said main bias resistor that is required to have a high power-withstanding capability and said trimming bias resistor that is not required to have a high power-withstanding capability, said main bias resistor being accommodated inside the enclosure and the trimming bias resistor mounted on the integrated circuit substrate outside the enclosure.

9. A hybrid integrated circuit module as set forth in claim 3, wherein:
    at least one electrode on which a particular chip component is mounted includes a projecting electrode portion approaching the other electrode on which the same chip component is mounted.

10. A hybrid integrated circuit module as set forth claim 5, wherein:
    said bias resistors consisting of said main bias resistor that is required to have a high power-withstanding capability and said trimming bias resistor that is not required to have a high power-withstanding capability, said main bias resistor being accommodated inside the enclosure and the trimming bias resistor mounted on the integrated circuit substrate outside the enclosure.

11. A hybrid integrated circuit module as set forth in claim 5, wherein:
    at least one electrode on which a particular chip component is mounted includes a projecting electrode portion approaching the other electrode on which the same chip component is mounted.

12. A hybrid integrated circuit module as set forth in claim 6, wherein:
    at least one electrode on which a particular chip includes a projecting electrode portion approaching the other electrode on which the same chip component is mounted.

13. A hybrid integrated circuit module as set forth in claim 8, wherein:
    at least one electrode on which a particular chip includes a projecting electrode portion approaching the other electrode on which the same chip component is mounted.

14. A hybrid integrated circuit module as set forth in claim 10, wherein:
    at least one electrode on which a particular chip includes a projecting electrode portion approaching the other electrode on which the same chip component is mounted.

* * * * *